US006319762B1

(12) United States Patent
Liaw et al.

(10) Patent No.: US 6,319,762 B1
(45) Date of Patent: Nov. 20, 2001

(54) METHOD FOR FABRICATING POLY-SPACERS

(75) Inventors: Shiou-han Liaw; Yau-feng Lo; Po-lung Chuang; Jia-ren Chen; Yen-hung Lai; Calvin Wu, all of Hsin Chu (TW)

(73) Assignee: TSMC-ACER Semiconductor Manufacturing Corp. (TW)

( * ) Notice: Subject to any disclaimer, the term of this patent is extended or adjusted under 35 U.S.C. 154(b) by 0 days.

(21) Appl. No.: 09/597,832

(22) Filed: Jun. 19, 2000

(51) Int. Cl.[7] .................. H01L 21/8238; H01L 21/8242
(52) U.S. Cl. ..................... 438/231; 438/232; 438/252
(58) Field of Search .................................. 438/185, 231, 438/232, 252, 301, 302, 395, 316

(56) References Cited

U.S. PATENT DOCUMENTS

| 5,943,576 | * | 8/1999 | Kapoor ............................ 438/302 |
| 6,090,653 | * | 7/2000 | Wu .................................. 438/231 |
| 6,127,236 | * | 10/2000 | Prall et al. ..................... 438/316 |
| 6,130,134 | * | 10/2000 | Chen ............................... 438/302 |
| 6,236,085 | * | 5/2001 | Kawaguchi et al. ........... 257/345 |

* cited by examiner

Primary Examiner—John F. Niebling
Assistant Examiner—Walter L. Lindsay, Jr.
(74) Attorney, Agent, or Firm—Martine & Penilla, LLP

(57) ABSTRACT

A method for fabricating poly-spacers used in a semiconductor substrate, comprising: forming an undoped first polysilicon layer on the semiconductor substrate; performing a first ion implantation with a first angle to implant impurities into the first polysilicon layer; performing a second ion implantation with a second angle to implant the impurities into the first polysilicon layer; forming a second polysilicon layer on the first polysilicon layer; and etching the first polysilicon layer and the second polysilicon layer to form spacers.

10 Claims, 6 Drawing Sheets

METHOD FOR FABRICATING POLY-SPACERS

BACKGROUND OF THE INVENTION a) Field of the Invention

The invention relates to a method for fabricating poly-spacers, more particularly, to a method for fabricating poly-spacers used in a semiconductor substrate.

b) Description of the Prior Art

Concerning flash memory in the submicron manufacturing process, the poly-spacer is widely used as a word line. However, there are some disadvantages in the conventional manufacturing process of poly-spacer word lines. The conventional technologies will be described herein with reference to the accompanying drawings.

The first conventional method for fabricating poly-spacer word lines in the flash memory cell is illustrated in FIG. 1. The reference numerals 1 and 2 represent the gate of a flash memory and the periphery MOS (Metal-Oxide Semiconductor) sections respectively and are used to represent the same structures in the following description. As shown in FIG. 1, in the first conventional method for fabricating poly-spacer word lines, an undoped poly-spacer is first formed and then impurities (such as P-type or A-type) are implanted into the undoped poly-spacer by an ion implantation at zero degrees. Finally, the memory cell is thermally annealed in order that the lattice structure deteriorated in the ion implantation step can be recovered and the impurities can be activated. The poly-spacer word lines are thus formed.

However, using the first conventional method for fabricating poly-spacer word lines, impurities will not be implanted into the poly-spacers everywhere because ion implantation is performed at zero degrees. Therefore, generation of the depletion gate phenomenon is inevitable, which causes the threshold voltage $V_t$, to drift and the reliability is thus deteriorated.

The second conventional method, as is illustrated in FIG. 2, makes some improvements over the first conventional method. This method is performed by the following steps: (1) forming an undoped polysilicon layer; (2) performing the ion implantation to the polysilicon layer twice at two different angles so as to prevent the depletion gate phenomenon; (3) forming poly-spacers by anisotropic dry etching.

However, the main drawback of the second conventional method is that the power control of the ion implantation needs to be very precise as the poly-spacer is thick. If the power is too low, impurities cannot be implanted into the poly-spacer with enough depth. On the contrary, if the power is too high, the implantation depth cannot be precisely controlled and the photoresist layer covering other sections may be burned out causing contamination in the word line channels.

The main difference between the third conventional method and the above-mentioned two methods is that instead of ion implanting impurities into the polysilicon layer after it is formed, the doped polysilicon layer in the third conventional method is formed by in-situ CVD (chemical vapor deposition) doping to prevent the generation of the depletion gate.

Although the third conventional method for fabricating poly-spacer word lines can achieve better quality in impurity and uniformity, the overall manufacturing process thereof is comparatively complicated when taking into consideration the integration of other periphery MOS sections. For example, after forming the doped polysilicon layer 3, as shown in FIG. 3A, dry etching is performed to remove the undesired section of the polysilicon layer 3 and the poly-spacer word line is formed (FIG. 3B). Then, the polysilicon layer is formed on the periphery MOS. For example, a lithography step and an etching step are utilized to form a cap layer 4 (FIG. 3C). Subsequently, an undoped polysilicon layer 5 is formed (FIG. 3D). Finally, a lithography step and an etching step are utilized to define a polysilicon layer on the periphery MOS.

In addition to the complicated manufacturing process, the thermal budget used in the third conventional method is quite high so that impurities in other diffusion layers are easily diffused again. Besides, reliability problems induced by over etching or incomplete etching due to the high aspect ratio of the poly-spacer exists.

SUMMARY OF THE INVENTION

Accordingly, an object of the invention is to provide a method for fabricating poly-spacer word lines having the advantages of: the depletion gate being eliminated, high reliability, a simple manufacturing process and a low thermal budget.

The method for fabricating poly-spacers in accordance with the invention comprises: forming an undoped first polysilicon layer on a semiconductor substrate; performing a first ion implantation with a first angle to implant impurities into the first polysilicon layer; performing a second ion implantation with a second angle to implant the impurities into the first polysilicon layer; forming a second polysilicon layer on the first polysilicon layer; and etching the first polysilicon layer and the second polysilicon layer to form spacers.

In addition, the invention provides a method for fabricating poly-spacers by which the poly-spacer word line and the polysilicon gate layer can be formed simultaneously. The method comprises: forming an undoped first polysilicon layer on a semiconductor substrate; performing a first lithography step to form a first photoresist layer covering sections of the first polysilicon layer which is not to be implanted with impurities; performing a first ion implantation with a first angle to implant impurities into the first polysilicon layer; performing a second ion implantation with a second angle to implant the impurities into the first polysilicon layer; removing the first photoresist layer; forming a second polysilicon layer on the first polysilicon layer; performing a second lithography step to form a second photoresist layer covering sections of the second polysilicon layer which is to be remained; etching the first polysilicon layer and the second polysilicon layer to form spacers; and removing the second photoresist layer.

DESCRIPTION OF THE PREFERRED EMBODIMENTS

The structure and manufacturing process of the poly-spacer in accordance with the invention will be described in detail with reference to the attached drawings.

Figure 1:
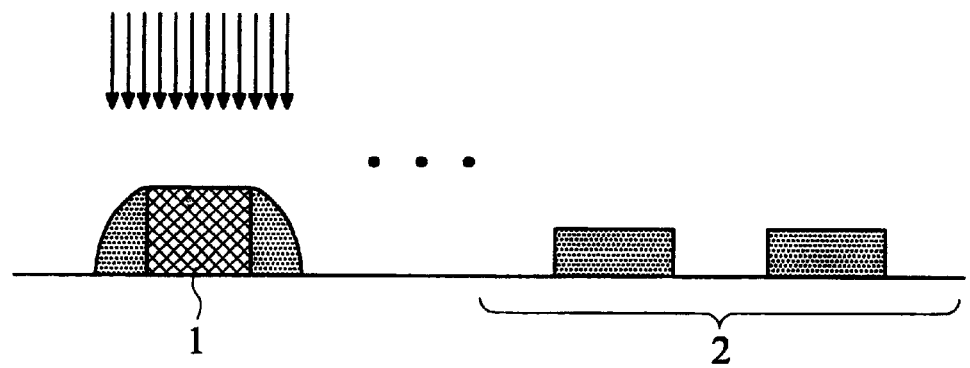
FIG. 1 is the schematic diagram of the first conventional method for fabricating poly-spacer word lines.
Figure 2:
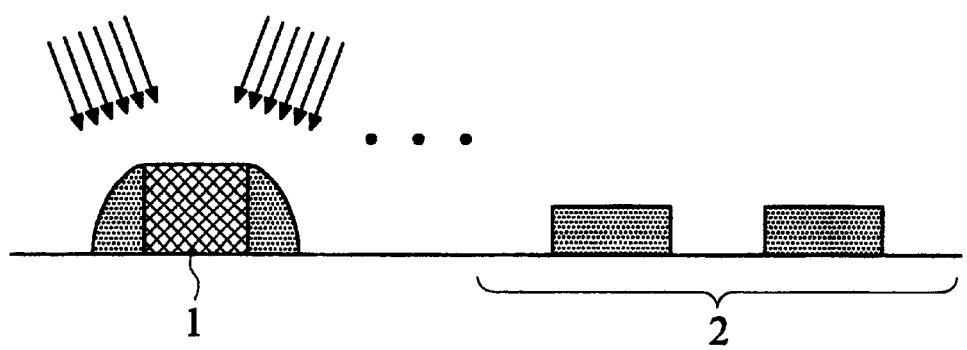
FIG. 2 is the schematic diagram of the second conventional method for fabricating poly-spacer word lines.
Figure 3A:
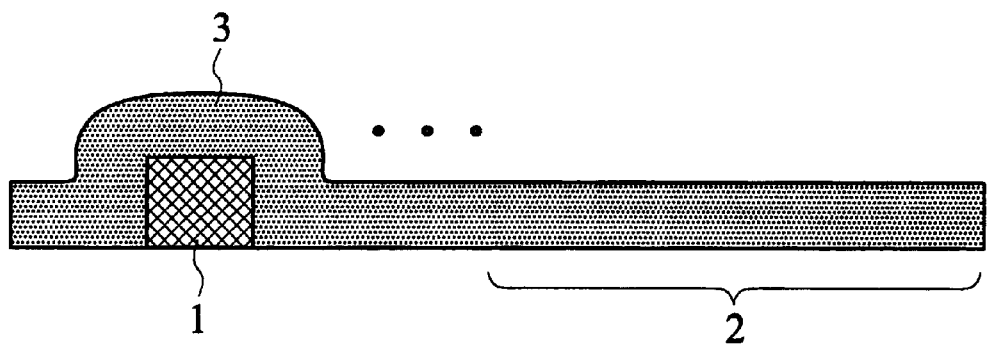
FIGS. 3A to 3E show the manufacturing process of the third conventional method for fabricating poly-spacer word lines.
Figure 3B:
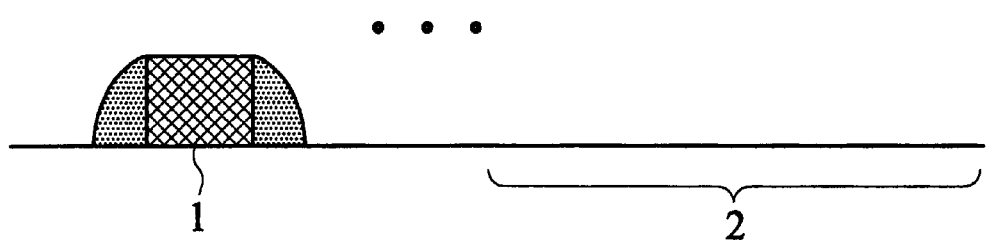
Figure 3C:
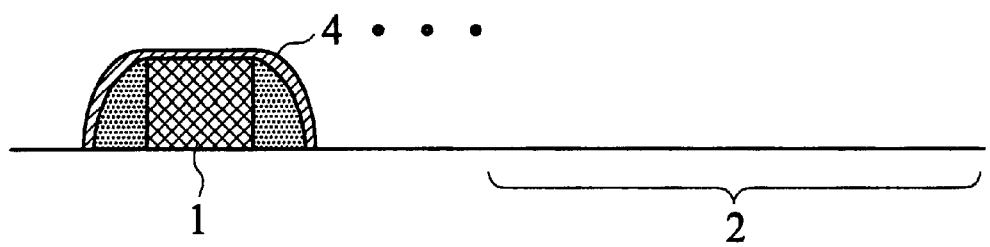
Figure 3D:
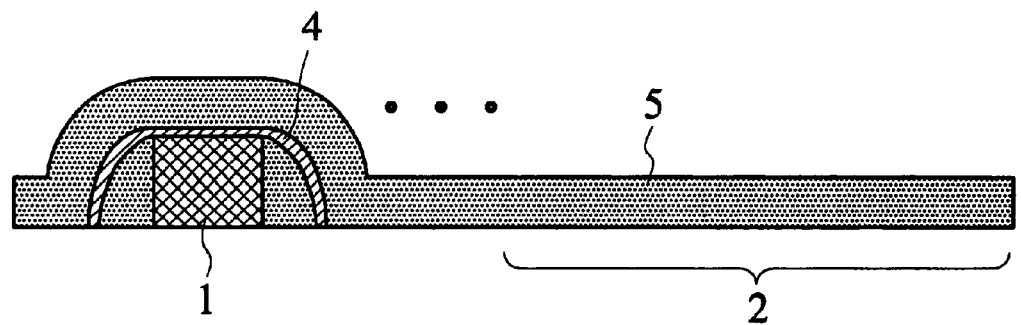
Figure 3E:
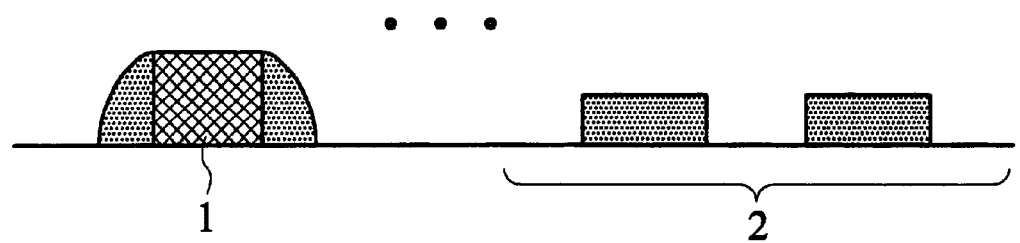
Figure 4A:
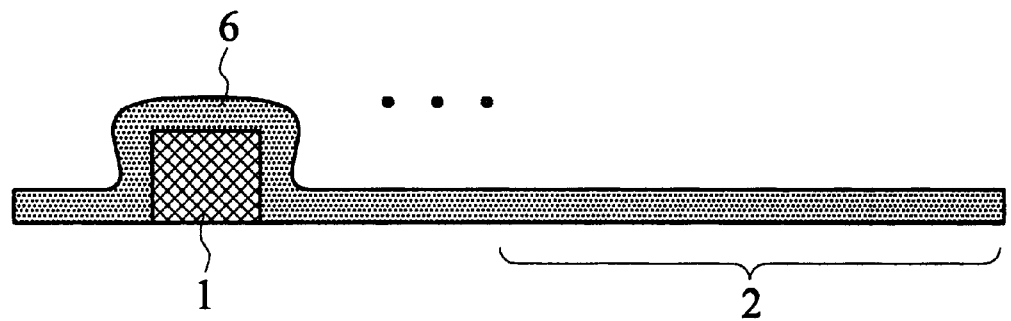
FIGS. 4A to 4E show the manufacturing process of the method for fabricating poly-spacer word lines in accordance with the invention.
Figure 4B:
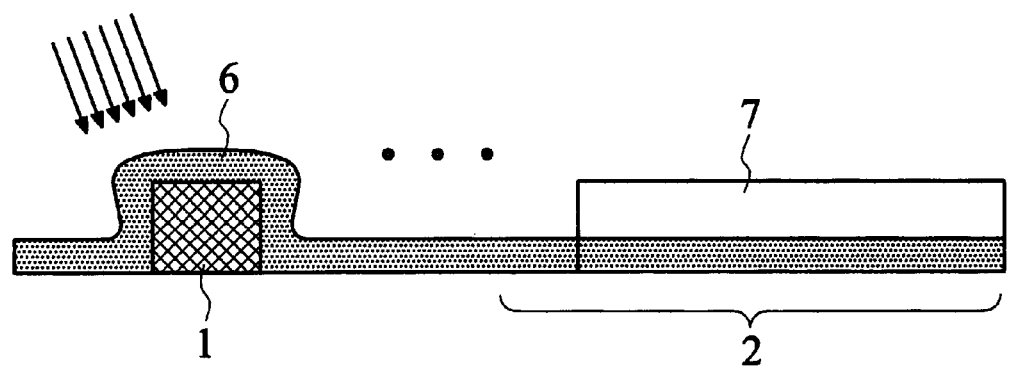
Figure 4C:
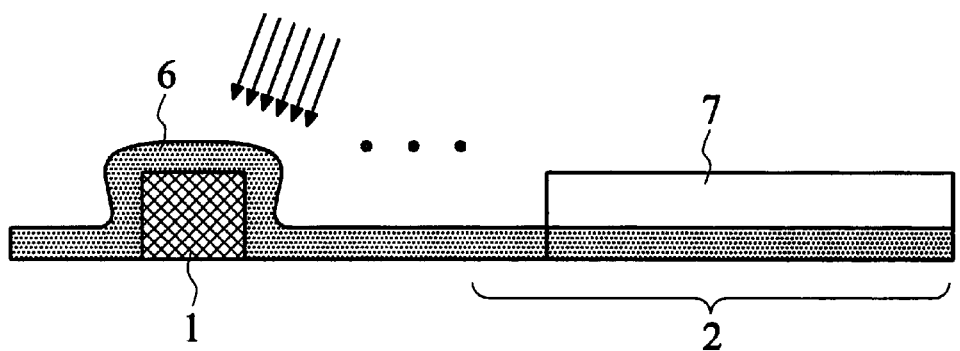
Figure 4D:
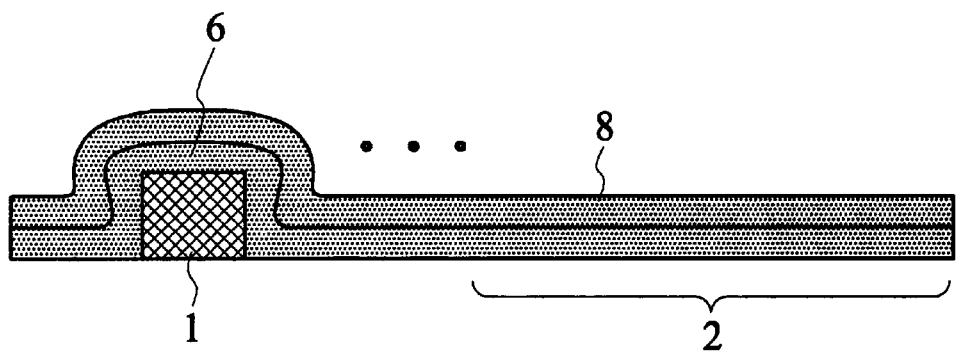
Figure 4E:
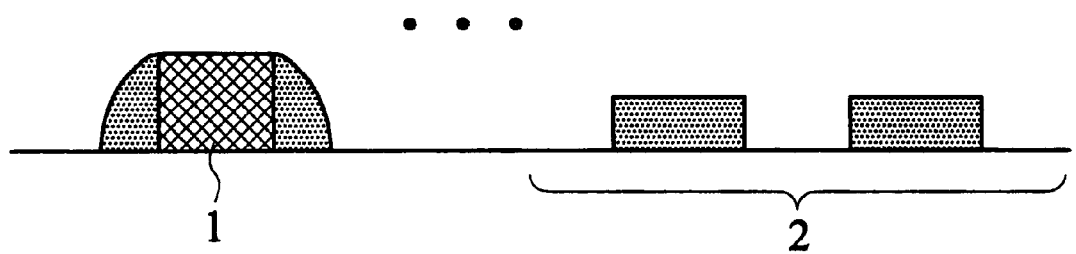

The method for fabricating poly-spacers in accordance with the invention, exemplified by a process applied to a flash memory integrated with periphery MOS sections, comprises:

forming a first polysilicon layer 6 on the entire semiconductor surface, as shown in FIG. 4A, and it should be noted that the polysilicon layer 6 covers all sections including periphery MOS sections 2;

forming a photoresist layer 7 covering the sections not to be doped with impurities, such as periphery MOS sections 2;

performing a first ion implantation with a predetermined angle, such as 10°, to dope impurities into the first polysilicon layer 6, as shown in FIG. 4B;

performing a second ion implantation with another predetermined angle, such as −10°, to dope impurities into the first polysilicon layer 6, as shown in FIG. 4C;

removing the photoresist layer 7;

forming an undoped second polysilicon layer 8 on the first polysilicon layer 6, as shown in FIG. 4D;

forming another photoresist layer covering the predetermined sections of polysilicon layer 8 in the periphery MOS sections 2 so as to form the polysilicon layers, such as the polysilicon gate;

etching the first polysilicon layer 6 and the second polysilicon layer 8 to form a poly-spacer; and removing the photoresist layer, as shown in FIG. 4E.

The poly-spacer and the polysilicon layer on the periphery MOS sections are thus formed. In the process described above, the dosage, energy and ion source in the first ion implantation are the same as those of the second ion implantation. The only difference is that the implantation angles are substantially symmetrical to each other. Consequently, the polysilicon layer, which is not covered by the photoresist layer 7, is fully implanted with impurities and the depletion gate is eliminated. At the same time, the distribution of the impurity on the sidewalls is the same.

From the above-mentioned structure and method in accordance with the invention, the depletion gate is eliminated because the ion implantation is performed twice at different angles. Further, the method in accordance with the invention employs two steps to form the polysilicon layer allowing the concentration and distribution profiles of the impurities implanted into the thin polysilicon layer to be easily controlled. Therefore, the drawback of the second conventional method described above can be eliminated. In addition, the poly-spacers and the polysilicon layers on the periphery MOS sections are formed in the same step. Consequently, the manufacturing process is simple and the thermal budget is low, which leads to high reliability.

The above-mentioned methods for fabricating poly-spacers in accordance with the invention are not limited to being employed in the flash memory or EEPROM. These methods can be employed in any semiconductor devices including poly-spacers. Furthermore, the poly-spacers in accordance with the invention are not limited to be used as word lines.

Furthermore, persons skilled in the art should know the method for fabricating poly-spacers could only be employed without consideration of the periphery MOS sections.

Therefore, the above-mentioned process is only a description of a preferred embodiment of the invention. The scope of the present invention is not limited to the preferred embodiment. Variations and modifications may be made without being separate from the scope of the invention.

What is claimed is:

1. A method for fabricating poly-spacers used in a semiconductor substrate, comprising:

forming an undoped first polysilicon layer on the semiconductor substrate;

performing a first ion implantation with a first angle to implant impurities into said first polysilicon layer;

performing a second ion implantation with a second angle to implant the impurities into said first polysilicon layer;

forming a second polysilicon layer on said first polysilicon layer; and etching said first polysilicon layer and said second polysilicon layer to form spacers.

2. A method for fabricating poly-spacers according to claim 1, wherein the impurities are selected from the group of Sb-type, P-type or A-type impurities.

3. A method for fabricating poly-spacers according to claim 1, wherein said etching steps of the first polysilicon layer and the second polysilicon layer are anisotropic etching.

4. A method for fabricating poly-spacers according to claim 1, wherein the second polysilicon layer is an undoped polysilicon layer.

5. A method for fabricating poly-spacers according to claim 1, wherein the first angle of the first ion implantation and the second angle of the second ion implantation are symmetrical to each other.

6. A method for fabricating poly-spacers used in a semiconductor substrate, comprising:

forming an undoped first polysilicon layer on the semiconductor substrate;

performing a first lithography step to form a first photoresist layer covering sections of the first polysilicon layer which is not to be implanted with impurities;

performing a first ion implantation with a first angle to implant impurities into the first polysilicon layer;

performing a second ion implantation with a second angle to implant the impurities into the first polysilicon layer;

removing the first photoresist layer;

forming a second polysilicon layer on the first polysilicon layer;

performing a second lithography step to form a second photoresist layer covering sections of said second polysilicon layer which are to remain;

etching the first polysilicon layer and the second polysilicon layer to form spacers; and removing the second photoresist layer.

7. A method for fabricating poly-spacers according to claim 6, wherein the impurities are selected from the group of Sb-type, P-type or A-type impurities.

8. A method for fabricating poly-spacers according to claim 6, wherein the first angle of the first ion implantation and the second angle of the second ion implantation are symmetrical to each other.

9. A method for fabricating poly-spacers according to claim 6, wherein the method of etching the first polysilicon layer and the second polysilicon layer is anisotropic etching.

10. A method for fabricating poly-spacers according to claim 6, wherein the second polysilicon layer is an undoped polysilicon layer.

* * * * *